United States Patent
Lee et al.

(10) Patent No.: US 10,547,322 B2
(45) Date of Patent: Jan. 28, 2020

(54) ANALOG-DIGITAL CONVERTER HAVING MULTIPLE FEEDBACK, AND COMMUNICATION DEVICE INCLUDING THE ANALOG-DIGITAL CONVERTER

(71) Applicant: SAMSUNG ELECTRONICS CO., LTD., Suwon-si, Gyeonggi-Do (KR)

(72) Inventors: Sang-Heon Lee, Seoul (KR); Michael Choi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/186,761

(22) Filed: Nov. 12, 2018

(65) Prior Publication Data

US 2019/0207620 A1  Jul. 4, 2019

(30) Foreign Application Priority Data

Jan. 2, 2018 (KR) .................. 10-2018-0000268
Nov. 8, 2018 (KR) .................. 10-2018-0136810

(51) Int. Cl.
*H03M 1/12* (2006.01)
*H03M 3/00* (2006.01)
(Continued)

(52) U.S. Cl.
CPC .......... *H03M 3/464* (2013.01); *H03M 3/398* (2013.01); *H03M 3/494* (2013.01); *H04B 1/16* (2013.01); *H04L 25/03* (2013.01)

(58) Field of Classification Search
CPC ........ H03M 3/37; H03M 3/378; H03M 3/464; H03M 1/1019; H03M 1/1038; H03M 1/74;
(Continued)

(56) References Cited

U.S. PATENT DOCUMENTS 5,012,247 A * 4/1991 Dillman .............. H03M 1/1023
341/120
5,638,072 A * 6/1997 Van Auken .......... H03M 1/804
341/141
(Continued)

FOREIGN PATENT DOCUMENTS

KR          101435978        8/2014

OTHER PUBLICATIONS

J. A. Fredenburg and M. P. Flynn, "A 90-MS/s 11-MHz-Bandwidth 62-dB SNDR Noise-Shaping SAR ADC," IEEE J. Solid-State Circuits, vol. 47, No. 12, pp. 2898-2904, Dec. 2012.
(Continued)

*Primary Examiner* — Linh V Nguyen
(74) *Attorney, Agent, or Firm* — Volentine, Whitt & Francos, PLLC

(57) ABSTRACT

An analog-digital converter has multiple feedback, and includes: a capacitor digital-analog converter including a plurality of switches driven by a digital code, and a plurality of capacitors respectively connected to the plurality of switches, wherein the capacitor digital-analog converter is configured to generate a residue voltage based on an analog input voltage and a voltage corresponding to the digital code; first and second feedback capacitors each storing the residue voltage; an integrator configured to generate an integral signal by integrating the residue voltage; first and second comparators respectively configured to generate first and second comparison signals from the integral signal; and a digital logic circuitry configured to receive the first and second comparison signals, and generate a digital output signal from the first and second comparison signals, the digital output signal corresponding to the digital code during a successive approximation register (SAR) analog-digital conversion interval, and the digital output signal corresponding to an average of first and second digital control
(Continued)

signals during a delta sigma analog-digital conversion interval, wherein the first and second comparison signals are respectively fed back to the first and second feedback capacitors. The analog-digital converter may be included in various electronic devices, including communication devices.

20 Claims, 10 Drawing Sheets

(51) Int. Cl.
  *H04B 1/16* (2006.01)
  *H04L 25/03* (2006.01)
(58) Field of Classification Search
  CPC .... H03M 3/384; H03M 3/388; H03M 1/1023; H03M 1/1071; H03M 1/109; H03M 1/1095; H03M 1/38; H03M 1/46; H03M 3/422; H03M 3/458; H03M 3/47; H03M 3/494
  USPC .......... 341/118–121, 143, 155, 172
  See application file for complete search history.

(56) References Cited

U.S. PATENT DOCUMENTS

| | | | | |
|---|---|---|---|---|
| 8,044,837 | B2* | 10/2011 | Mboli | H03M 1/125 341/118 |
| 8,102,292 | B1* | 1/2012 | Van Ess | H03M 3/426 341/143 |
| 8,547,260 | B2 | 10/2013 | Sestok et al. | |
| 8,547,270 | B1* | 10/2013 | Strode | H03M 1/1061 341/155 |
| 8,660,506 | B2 | 2/2014 | Furuta et al. | |
| 8,947,285 | B2 | 2/2015 | Ceballos | |
| 8,947,286 | B2* | 2/2015 | Chen | H03M 1/145 341/161 |
| 8,970,227 | B2 | 3/2015 | Nys et al. | |
| 9,106,243 | B2* | 8/2015 | Lee | H03M 1/1023 |
| 9,197,240 | B1 | 11/2015 | Kinyua | |
| 9,425,818 | B1 | 8/2016 | Rajaee et al. | |
| 9,654,130 | B2 | 5/2017 | Venca et al. | |
| 2011/0050471 | A1* | 3/2011 | Kumar | H03M 3/368 341/143 |
| 2016/0072515 | A1 | 3/2016 | Kinyua | |
| 2017/0026053 | A1 | 1/2017 | Lee | |
| 2017/0126239 | A1* | 5/2017 | Sun | H03M 1/08 |
| 2018/0309458 | A1* | 10/2018 | Bandyopadhyay | H03M 1/0854 |

OTHER PUBLICATIONS

C. Liu and M. Huang, "A 0.46mW 5MHz-BW 79.7dB-SNDR Noise-Shaping SAR ADC with Dynamic-Amplifier-Based FIR-IIR Filter," in IEEE Int. Solid-State Circuits Conf. (ISSCC) Dig. Tech. Papers, 2017, pp. 466-467.
W. Guo, H. Zhuang, and N. Sun, "A 13b-ENOB 173dB-FoM 2nd-order NS SAR ADC with Passive Integrators," in IEEE Symp. VLSI Circuits Dig. Jun. 2017, pp. 236-237.
Lieuwe B. Lenne, "A Compact Recording Array for Neural Interfaces," IEEE 2013, pp. 97-100.
Lieuwe B. Leene et al., "A 0.016mm2 12 b SAR With 14 fJ/conv. for Ultra Low Power Biosensor Arrays," IEEE Transactions on Circuits and Systems-I: Regular Papers, vol. 65, No. 10, Oct. 2017, pp. 2655-2665.

* cited by examiner

| | SINGLE FEEDBACK | MULTIPLE FEEDBACK |
|---|---|---|
| NUMBER OF COMPARATORS | 1 | K |
| NOISE POWER | $V_N^2$ | $\dfrac{V_N^2}{K^2}$ |
| POWER CONSUMPTION | P | P/K |
| $V_{OS.SAR} - V_{OS.DS}$ | $V_{OS.COMP} / g_m R$ | $\approx 0$ |

ANALOG-DIGITAL CONVERTER HAVING MULTIPLE FEEDBACK, AND COMMUNICATION DEVICE INCLUDING THE ANALOG-DIGITAL CONVERTER

CROSS-REFERENCE TO RELATED APPLICATION

This application claims the benefit of Korean Patent Application No. 10-2018-0000268, filed on Jan. 2, 2018, in the Korean Intellectual Property Office, the disclosure of which is incorporated herein in its entirety by reference.

BACKGROUND

The inventive concept relates to an analog-digital converter, and more particularly, to an analog-digital converter having multiple feedback, and a communication device including the analog-digital converter.

An analog-digital converter is an apparatus that converts an analog input signal to a digital output signal. For example, a wireless communication system uses the analog-digital converter to convert a received radio frequency (RF) signal to an analog baseband signal and generate a digital output signal from the analog baseband signal. Types of analog-digital converters include a flash-type analog-digital converter operating at a Nyquist rate, a successive approximation register (SAR) type analog-digital converter, and a delta sigma analog-digital converter operating at an oversampling frequency higher than Nyquist rate, which are used in application fields according to their characteristics.

SUMMARY

According to an aspect of the inventive concept, there is provided an analog-digital converter having multiple feedback, the analog-digital converter including: a capacitor digital-analog converter including a plurality of switches driven by a digital code, and a plurality of capacitors respectively connected to the plurality of switches, wherein the capacitor digital-analog converter is configured to generate a residue voltage based on an analog input voltage and a voltage corresponding to the digital code; first and second feedback capacitors each storing the residue voltage; an integrator configured to generate an integral signal by integrating the residue voltage; first and second comparators respectively configured to generate first and second comparison signals from the integral signal; and a digital logic circuitry configured to receive the first and second comparison signals, and generate a digital output signal from the first and second comparison signals, the digital output signal corresponding to the digital code during a successive approximation register (SAR) analog-digital conversion interval, and the digital output signal corresponding to an average of first and second digital control signals during a delta sigma analog-digital conversion interval, wherein the first and second comparison signals are respectively fed back to the first and second feedback capacitors by the first and second digital control signals.

According to another aspect of the inventive concept, there is provided an analog-digital converter having multiple feedback, the analog-digital converter including: a capacitor digital-analog converter including a plurality of switches driven by a digital code, and a plurality of capacitors respectively connected to the plurality of switches, and wherein the analog-digital converter is configured to generate a residue voltage based on an analog input voltage and a voltage corresponding to the digital code; first through $K^{th}$ feedback capacitors each storing the residue voltage; an integrator configured to generate an integral signal by integrating the residue voltage; and first through $K^{th}$ comparators configured to respectively generate first through $K^{th}$ comparison signals from the integral signal, wherein the first through $K^{th}$ comparison signals are respectively fed back to the first through $K^{th}$ feedback capacitors, and a capacitance of each of the first through $K^{th}$ feedback capacitors is in inverse proportion to K, wherein K is an integer of at least 2.

According to yet another aspect of the inventive concept, there is provided a communication device including: an analog-digital converter having multiple feedback and configured to convert an analog input signal to a digital output signal based on a reference voltage, wherein the analog input signal is produced from a communication signal received by the communication device; and a reference voltage generator providing the reference voltage to the analog-digital converter, wherein the analog-digital converter includes: a capacitor digital-analog converter configured to receive the reference voltage, the analog input signal, and a digital code, and generate a residue voltage based on the reference voltage, a voltage corresponding to the digital code, and a voltage corresponding to the analog input signal; first and second feedback capacitors each storing the residue voltage; an integrator configured to generate an integral signal by integrating the residue voltage; and first and second comparators configured to respectively generate first and second comparison signals from the integral signal, wherein the first and second comparison signals are respectively fed back to the first and second feedback capacitors.

According to still another aspect of the inventive concept, there is provided an analog-digital converter including: a capacitor digital-analog converter including a plurality of switches driven by a digital code, and a plurality of capacitors respectively connected to the plurality of switches, wherein the analog-digital converter is configured to generate a residue voltage based on an analog input voltage and a voltage corresponding to the digital code; a feedback capacitor storing the residue voltage; an integrator configured to generate an integral signal by integrating the residue voltage; a comparator configured to generate a comparison signal from the integral signal; and a feedback switch connected to the feedback capacitor in series, and connected to a ground voltage terminal or a reference voltage terminal to which a reference voltage is applied, in response to a digital control signal corresponding to the comparison signal; and a digital logic circuitry configured to receive the comparison signal, and generate a digital output signal from the comparison signal, wherein the analog-digital converter operates at a Nyquist rate with respect to the analog input voltage.

According to a further aspect of the inventive concept, there is provided an analog-digital conversion method performed by an analog-digital converter, the analog-digital conversion method including: receiving an analog input signal; sampling the analog input signal in response to a sampling clock; generating a residue signal by performing a successive approximation register (SAR) analog-digital conversion operation on the sampled analog input signal; performing a delta sigma analog-digital conversion operation on the residue signal by using multiple feedback; and generating a digital output signal according to a result of performing the SAR analog-digital conversion operation and a result of performing the delta sigma analog-digital conversion operation.

According to a yet further aspect of the inventive concept there is provided a device, comprising: a plurality of switches each connected to one of: an input voltage terminal to which an analog input signal is applied, a reference voltage terminal to which the reference voltage is applied, and a ground voltage terminal, in response to a digital code supplied to the switches; a plurality of capacitors each having a first terminal connected to at least one of the plurality of switches, and further having a second terminal, wherein the second terminals of the capacitors are connected together to generate a residue voltage based on the analog input voltage and a voltage corresponding to the digital code; first and second feedback capacitors each storing the residue voltage; an integrator configured to generate an integral signal by integrating the residue voltage; and first and second comparators respectively configured to generate first and second comparison signals from the integral signal, wherein the first and second comparison signals are respectively fed back to the first and second feedback capacitors.

BRIEF DESCRIPTION OF THE DRAWINGS

Embodiments of the inventive concept will be more clearly understood from the following detailed description taken in conjunction with the accompanying drawings.

DETAILED DESCRIPTION OF THE EMBODIMENTS

Hereinafter, one or more embodiments of the inventive concept are described in detail with reference to accompanying drawings.

Figure 1:
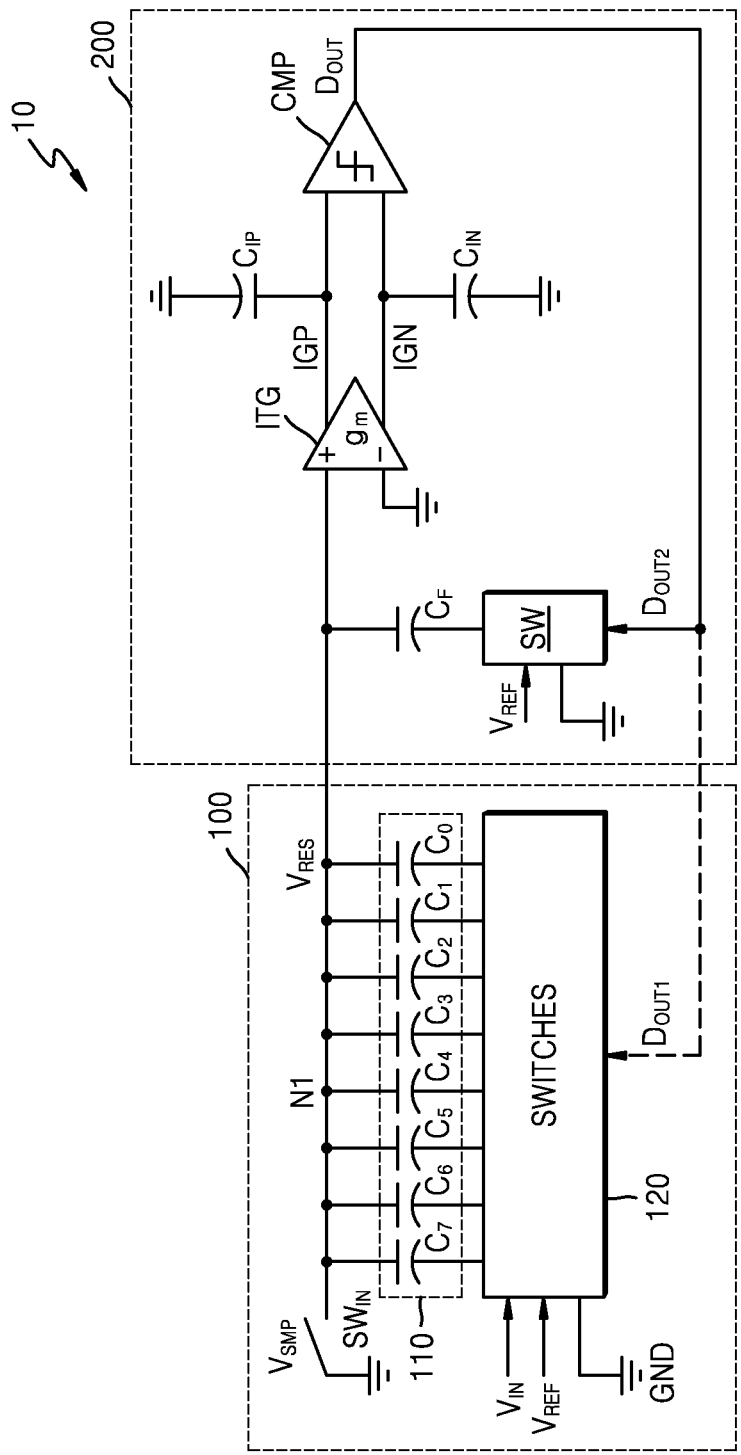
FIG. 1 is a circuit diagram of an embodiment of an analog-digital converter.

FIG. 1 is a circuit diagram of an embodiment of an analog-digital converter 10.

Referring to FIG. 1, analog-digital converter 10 may include a capacitor digital-analog converter (DAC) 100 and a delta sigma analog-digital converter 200. Here, a capacitor DAC refers to a DAC which includes a parallel capacitor network having individual capacitors which are connected or disconnected by switches based on an input digital word or code. Here, the parallel capacitor network of capacitor DAC 100 comprises eight capacitors 110 (C0, C1, . . . C7) which are connected by switches 120. In other embodiments, the number of capacitors in the parallel capacitor network may be more or less than eight.

Analog-digital converter 10 may receive an analog input voltage $V_{IN}$, and generate a digital output signal $D_{OUT}$ by performing analog-digital conversion on the analog input voltage $V_{IN}$. According to an embodiment, analog-digital converter 10 may be a noise shaping successive approximation register (SAR) analog-digital converter operating at a Nyquist rate. Hereinafter, operations and structures of capacitor DAC 100 and delta sigma analog-digital converter 200 will be described.

Figure 2:
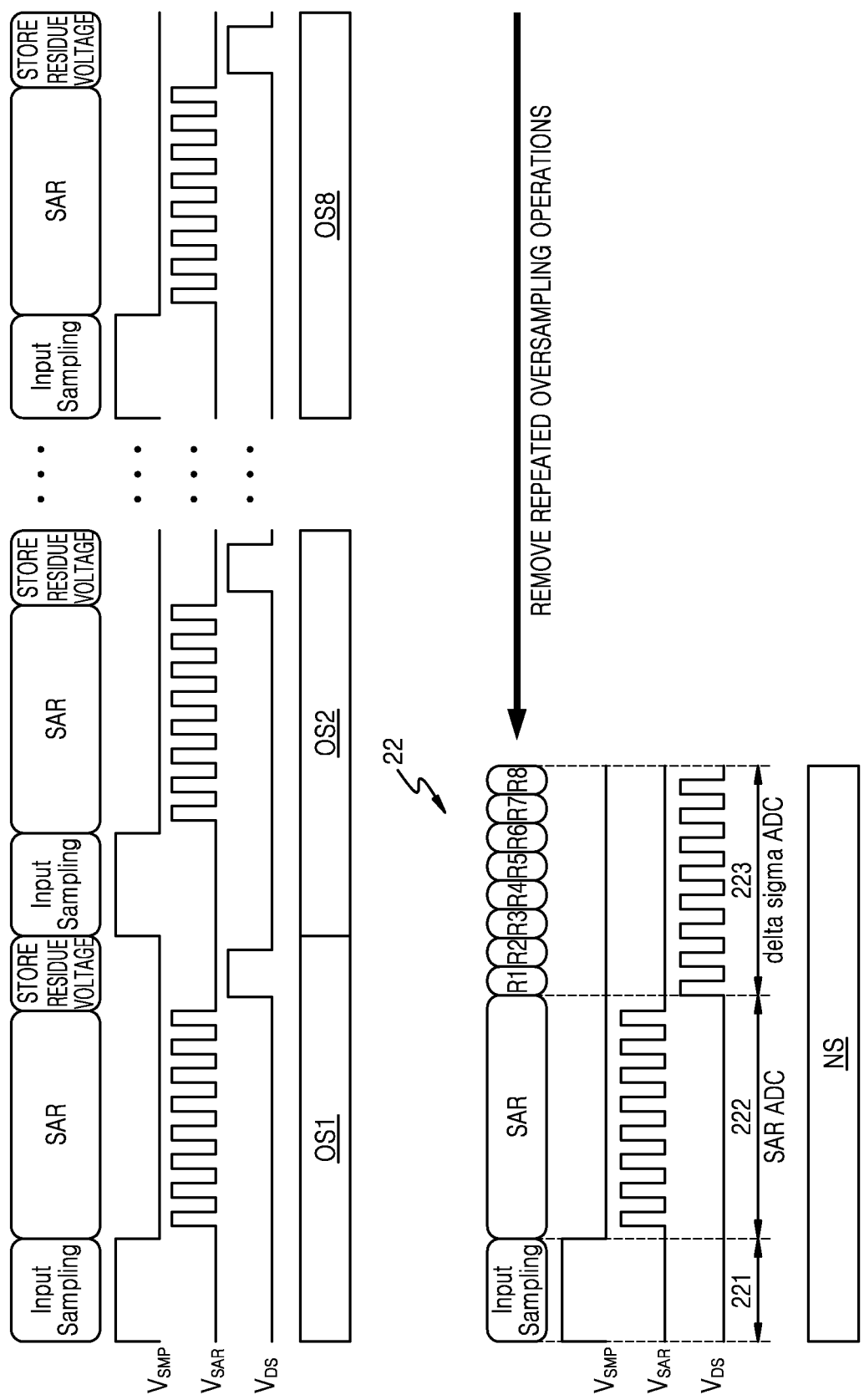
FIG. 2 is a timing diagram showing operations of the analog-digital converter of FIG. 1.

Capacitor DAC 100 may receive the analog input voltage $V_{IN}$, a reference voltage $V_{REF}$, and a ground voltage GND, and sample the analog input voltage $V_{IN}$ during a sampling interval or section (for example, a sampling interval 221 of FIG. 2). Also, capacitor DAC 100 may generate an internal voltage from the reference voltage $V_{REF}$ according to a digital code $D_{OUT1}$, and generate a residue voltage $V_{RES}$ via calculation of the sampled analog input voltage $V_{IN}$ and the internal voltage. The digital code $D_{OUT1}$ may be input to capacitor DAC 100 during an SAR analog-digital conversion interval or section (for example, an SAR analog-digital conversion interval 222 of FIG. 2). The digital code $D_{OUT1}$ may include a plurality of bits, and may sequentially increase or decrease from an upper bit. For example, the residue voltage $V_{RES}$ may correspond to a difference between the sampled analog input voltage $V_{IN}$ and the internal voltage.

Capacitor DAC 100 may include the plurality of capacitors 110 and the plurality of switches 120. Also, capacitor DAC 100 may further include an input switch $SW_{IN}$. Switching of the input switch $SW_{IN}$ may be controlled by a sampling clock $V_{SMP}$. According to an embodiment, analog-digital converter 10 may be an asynchronous SAR analog-digital converter, and the sampling clock $V_{SMP}$ may be applied from an external source. When the sampling clock $V_{SMP}$ is at a logic high level, the input switch $SW_{IN}$ may be turned on and the analog input voltage $V_{IN}$ may be sampled.

A first terminal of each of the plurality of capacitors 110 may be commonly connected to a first node N1, and a second terminal of each of the plurality of capacitors 110 may be connected to the plurality of switches 120. Each of the plurality of switches 120 may be connected to one of the analog input voltage $V_{IN}$, the reference voltage $V_{REF}$, and the ground voltage GND according to a level of each of a plurality of bits included in the digital code $D_{OUT1}$.

For example, the plurality of capacitors 110 may include $0^{th}$ through $7^{th}$ capacitors $C_0$ through $C_7$ respectively connected to the plurality of switches 120. For example, a capacitance of the first capacitor $C_1$ may correspond to $2^0*C$ (here, C denotes unit capacitance), a capacitance of the second capacitor $C_2$ may correspond to $2^1*C$, a capacitance of the third capacitor $C_3$ may correspond to $2^2*C$, a capacitance of the fourth capacitor $C_4$ may correspond to $2^3*C$, a capacitance of the fifth capacitor $C_5$ may correspond to $2^4*C$, a capacitance of the sixth capacitor $C_6$ may correspond to $2^5*C$, and a capacitance of the seventh capacitor $C_7$ may correspond to $2^6*C$. A capacitance of the $0^{th}$ capacitor $C_0$ may be the same as the capacitance of the first capacitor $C_1$, i.e., may correspond to $2^0*C$, and the $0^{th}$ capacitor $C_0$ may be referred to as a dummy capacitor.

Delta sigma analog-digital converter 200 may receive the residue voltage $V_{RES}$, and generate the digital output signal $D_{OUT}$ by performing a delta sigma analog-digital conversion operation on the residue voltage $V_{RES}$ according to a digital control signal $D_{OUT2}$. The digital control signal $D_{OUT2}$ may be input to delta sigma analog-digital converter 200 during a delta sigma analog-digital conversion interval or section (for example, a delta sigma analog-digital conversion interval 223 of FIG. 2). For example, delta sigma analog-digital converter 200 may include a feedback capacitor $C_F$, a feedback switch SW, an integrator ITG, first and second integral capacitors $C_{IP}$ and $C_{IN}$, and a comparator CMP.

The integrator ITG may generate first and second integral signals IGP and IGN by integrating the residue voltage $V_{RES}$. For example, the integrator ITG may be embodied as a differential integrator, wherein the first integral signal IGP may correspond to a positive integral signal and the second integral signal IGN may correspond to a negative integral signal. The first integral capacitor $C_{IP}$ may store the first integral signal IGP and the second integral capacitor $C_{IN}$ may store the second integral signal IGN. However, an embodiment is not limited thereto, and the integrator ITG may be embodied as a single ended integrator, and in this case, the integrator ITG may generate a single integral signal.

The comparator CMP may receive a first voltage corresponding to the first integral signal IGP through a first input terminal, receive a second voltage corresponding to the second integral signal IGN through a second input terminal, and generate the digital output signal $D_{OUT}$ through a comparing operation of the first and second voltages. Here, the digital output signal $D_{OUT}$ output in the SAR analog-digital conversion interval may correspond to the digital code $D_{OUT1}$, and the digital output signal $D_{OUT}$ output in the delta sigma analog-digital conversion interval may correspond to the digital control signal $D_{OUT2}$.

Analog-digital converter 10 may operate as an SAR analog-digital converter by including capacitor DAC 100, and may be referred to as an SAR analog-digital converter. In a general SAR analog-digital converter operating at a high speed, a frequency of an internal clock signal needs to be much higher than a frequency of the sampling clock $V_{SMP}$ such that an analog-digital conversion operation is performed, and the comparator CMP needs to have a high bandwidth to operate according to the internal clock. Accordingly, a noise bandwidth is increased and thus comparator noise is increased, and such an increase in the comparator noise restricts the resolution of the general SAR analog-digital converter operating at a high speed from increasing. However, analog-digital converter 10 may further include delta sigma analog-digital converter 200 to be embodied as a noise shaping SAR analog-digital converter, and accordingly, high resolution may be realized without restriction of comparator noise.

According to the current embodiment, analog-digital converter 10 may operate in two stages. A first stage may be an SAR analog-digital conversion operation (see SAR analog-digital conversion interval 222 in FIG. 2 below) in which the analog input voltage $V_{IN}$ is sampled and converted to a digital signal, and at this time, an output of analog-digital converter 10 may correspond to the digital code $D_{OUT1}$. A second stage may be a delta sigma analog-digital conversion operation (see delta sigma analog-digital conversion interval 223 in FIG. 2 below) in which the residue voltage $V_{RES}$ is integrated, and at this time, an output of analog-digital converter 10 may correspond to the digital control signal $D_{OUT2}$. The digital output signal $D_{OUT}$, i.e., a final output of analog-digital converter 10 that performed the first and second stages, may be obtained as Equation 1.

$$D_{OUT}(z) = \quad\quad\quad \text{[Equation 1]}$$
$$V_{IN}(z) + \left(\frac{H(z)}{1+H(z)} - \frac{H(z)}{1+H(z)}\right)[Q_1(z) + V_{N,COMP1}] +$$
$$\frac{1}{1+H(z)}[Q_2(z) + V_{N,COMP2}]$$

Here, $V_{IN}$ denotes an analog input voltage, $V_{IN}(z)$ denotes a signal generated by transforming the analog input voltage $V_{IN}$ to z-domain, $H(z)$ denotes a transfer function according to the integrator ITG and the first and second integral capacitors $C_{IP}$ and $C_{IN}$, and $$\frac{1}{1+Hz}$$

denotes a noise transfer function. Also, $Q_1$ denotes quantization noise of the SAR analog-digital converter, $V_{N,COMP1}$ denotes comparator noise of the SAR analog-digital converter, $Q_2$ denotes quantization noise of the delta sigma analog-digital converter, and $V_{N,COMP2}$ denotes comparator noise of the delta sigma analog-digital converter. As indicated by Equation 1, noise of the SAR analog-digital converter, i.e., the quantization noise $Q_1$ and the comparator noise $V_{N,COMP1}$, are removed, and noise of the delta sigma analog-digital converter, i.e., the quantization noise $Q_2$ and the comparator noise $V_{N,COMP2}$, are shaped to $$\frac{1}{1+Hz}.$$

In detail, after the SAR analog-digital conversion operation is performed on the sampled analog input voltage $V_{IN}$, the residue voltage $V_{RES}$ corresponding to quantization noise and comparator noise is stored in the first node N1 of capacitor DAC 100. The residue voltage $V_{RES}$ is stored in the feedback capacitor $C_F$, and the delta sigma analog-digital conversion operation is performed on the stored residue voltage $V_{RES}$ to obtain an output result in which the quantization noise and the comparator noise are shaped. Such an operation is referred to as noise shaping. As such, analog-digital converter 10 may realize high resolution without restriction due to comparator noise, even when operating at a high speed.

FIG. 2 is a timing diagram showing operations of analog-digital converter 10 of FIG. 1. The operations of analog-digital converter 10 will be described with reference to FIGS. 1 and 2.

First, operations 21 of an analog-digital converter operating at an oversampling frequency, according to a comparative example, are described. The analog-digital converter operating at the oversampling frequency may sequentially perform a plurality of oversampling intervals, i.e., first through eighth oversampling intervals OS1 through OS8, to obtain one output result. The oversampling frequency may be a frequency higher than a Nyquist frequency by an oversampling ratio. The first oversampling interval OS1 may include a sampling interval in which an input signal is sampled according to the sampling clock $V_{SMP}$, an SAR analog-digital conversion interval in which an SAR analog-digital conversion operation is performed according to an SAR clock $V_{SAR}$, and a delta sigma analog-digital conversion interval (labeled STORE RESIDUE VOLTAGE in FIG. 2) in which a delta sigma analog-digital conversion operation is performed according to a delta sigma clock $V_{DS}$. Here, since a residue voltage may be stored in the delta sigma analog-digital conversion interval, the plurality of oversampling intervals may be performed by as much as the number of times the residue voltage is stored. Accordingly, the analog-digital converter operating at the oversampling frequency may incur a long operating time for obtaining one output result.

Hereafter, operations 22 of the analog-digital converter 10 operating at a Nyquist frequency are described. Analog-digital converter 10 may operate at the Nyquist frequency to reduce comparator noise generated when operating at a high speed. The Nyquist frequency or a Nyquist rate is a minimum sampling frequency required to reconstruct a digital signal to an analog signal, and may correspond to a frequency which is twice the highest frequency of an input signal. Accordingly, analog-digital converter 10 may include a Nyquist sampling interval NS, in which repeated sampling operations and an SAR analog-digital conversion operation of oversampling intervals are removed, to obtain one output result.

The Nyquist sampling interval NS may include sampling interval 221 in which the analog input voltage $V_{IN}$ is sampled according to the sampling clock $V_{SMP}$, SAR analog-digital conversion interval 222 (i.e., SAR ADC 222 in FIG. 2) in which the SAR analog-digital conversion operation is performed according to the SAR clock $V_{SAR}$, and delta sigma analog-digital conversion interval 223 (i.e., delta sigma ADC 223 in FIG. 2), in which the delta sigma analog-digital conversion operation is performed according to the delta sigma clock $V_{DS}$. Here, one output result may be obtained by integrating the residue voltage $V_{RES}$ N times, for example, 8 times, in delta sigma analog-digital conversion interval 223. Accordingly, analog-digital converter 10 operating at the Nyquist frequency may have a short operating time for obtaining one output result.

Figure 3:
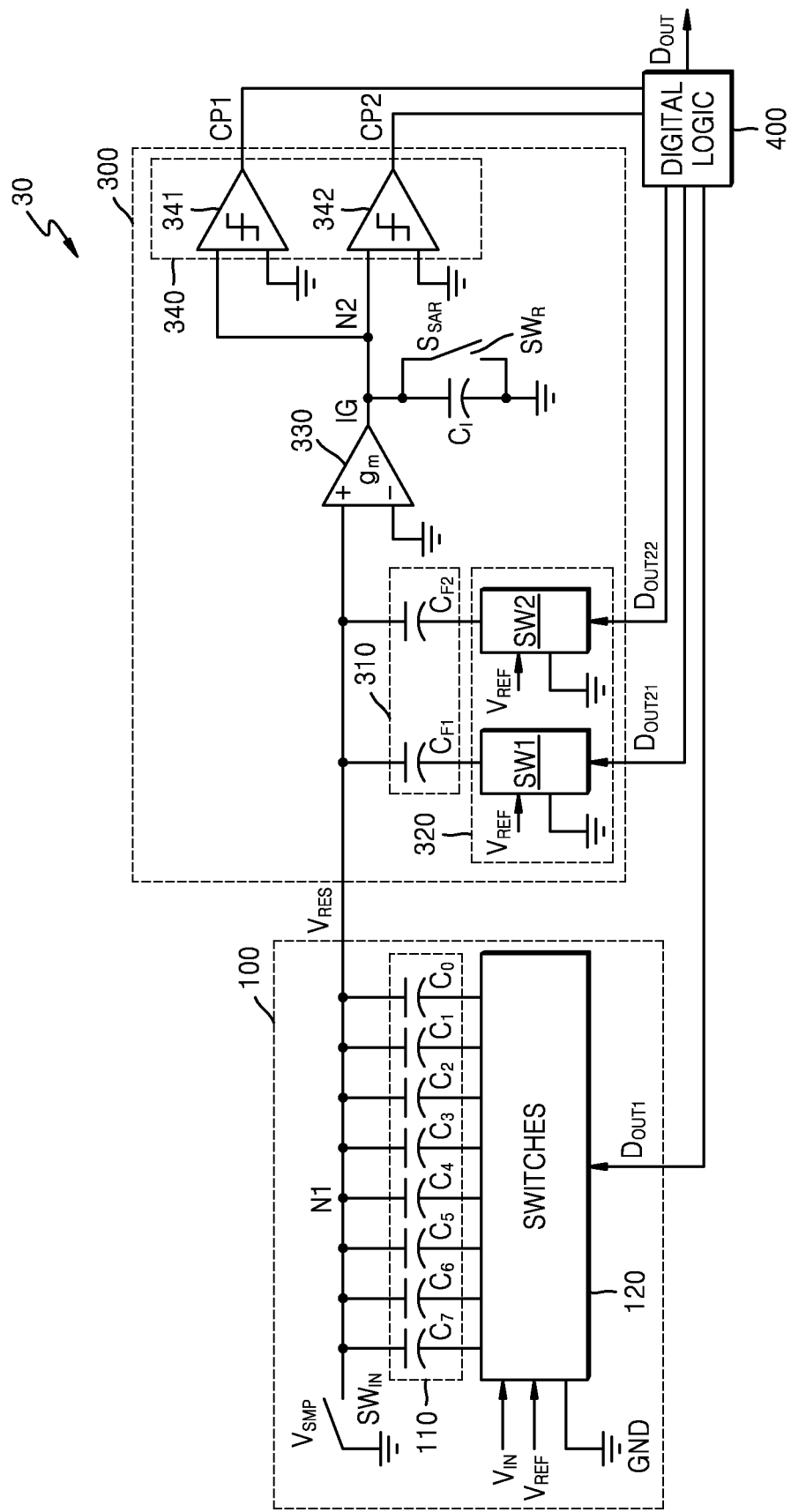
FIG. 3 is a circuit diagram of an embodiment of an analog-digital converter having multiple feedback.

FIG. 3 is a circuit diagram of an embodiment of an analog-digital converter 30 having multiple feedback.

Referring to FIG. 3, analog-digital converter 30 having multiple feedback may include capacitor DAC 100 and a delta sigma analog-digital converter 300. Also, analog-digital converter 30 having multiple feedback may further include digital logic circuitry 400. According to an embodiment, analog-digital converter 30 may be a noise shaping SAR analog-digital converter operating at a Nyquist rate. Capacitor DAC 100 may be identically realized as capacitor DAC 100 of FIG. 1, and thus overlapping descriptions thereof are not provided again. Delta sigma analog-digital converter 300 may have a multiple feedback structure. Hereinafter, delta sigma analog-digital converter 300 is mainly described.

Delta sigma analog-digital converter 300 may include a plurality of feedback capacitors 310, a plurality of feedback switches 320, an integrator 330, an integral capacitor $C_I$, a reset switch $SW_R$, and a plurality of comparators 340. The number of feedback capacitors 310 and the number of feedback switches 320 may be the same as the number of comparators 340. For example, feedback capacitors 310 may include first and second feedback capacitors $C_{F1}$ and $C_{F2}$, feedback switches 320 may include first and second feedback switches SW1 and SW2, and comparators 340 may include first and second comparators 341 and 342. However, embodiments are not limited thereto, and the plurality of comparators 340 may include two or more comparators, and accordingly, the numbers of feedback capacitors 310 and feedback switches 320 may increase.

The first and second feedback capacitors $C_{F1}$ and $C_{F2}$ may each store the residue voltage $V_{RES}$. According to an embodiment, a capacitance of the first feedback capacitor $C_{F1}$ and a capacitance of the second feedback capacitor $C_{F2}$, may be the same as each other. First terminals of the first and second feedback capacitors $C_{F1}$ and $C_{F2}$, are commonly connected to the first node N1, and second terminals of the first and second feedback capacitors $C_{F1}$ and $C_{F2}$ may be respectively connected to the first and second feedback switches SW1 and SW2. The first feedback switch SW1 may be connected to one of the reference voltage $V_{REF}$ and the ground voltage GND in response to a first digital control signal $D_{OUT21}$. The second feedback switch SW2 may be connected to one of the reference voltage $V_{REF}$ and the ground voltage GND in response to a second digital control signal $D_{OUT22}$. Here, the switches 120 may include a least significant bit (LSB) switch driven by an LSB of the digital code $D_{OUT1}$, the plurality of capacitors 110 may include an LSB capacitor connected to the LSB switch, and the first and second capacitances of the first and second feedback capacitors $C_{F1}$ and $C_{F2}$ may be the same as a capacitance of the LSB capacitor.

Integrator 330 may generate an integral signal IG by integrating the residue voltage $V_{RES}$. A first input terminal of integrator 330 may receive the residue voltage $V_{RES}$, a second input terminal may receive the ground voltage GND, and an output terminal may be connected to a second node N2. The integral capacitor $C_1$ may be connected between the second node N2 and a ground voltage terminal, and the reset switch $SW_R$ may be connected across the integral capacitor $C_1$ in parallel. The reset switch $SW_R$ may be switched on or off in response to an SAR control signal $S_{SAR}$, and accordingly, the integral signal IG stored in the integral capacitor $C_1$ may be reset.

First comparator 341 may generate a first comparison signal CP1 from the integral signal IG. According to an embodiment, first comparator 341 may include a first input terminal receiving the integral signal IG by being connected to the second node N2, and a second input terminal receiving the ground voltage GND. Accordingly, first comparator 341 compares the integral signal IG to the ground voltage GND to generate the first comparison signal CP1. However, embodiments are not limited thereto, and the second input terminal of first comparator 341 may receive a common voltage instead of the ground voltage GND.

Second comparator 342 may generate a second comparison signal CP2 from the integral signal IG. According to an embodiment, second comparator 342 may include a first input terminal receiving the integral signal IG by being connected to the second node N2, and a second input terminal receiving the ground voltage GND. Accordingly, second comparator 342 compares the integral signal IG and the ground voltage GND to generate the second comparison signal CP2. However, embodiments are not limited thereto, and the second input terminal of second comparator 342 may receive a common voltage instead of the ground voltage GND.

Digital logic circuitry 400 may receive the first and second comparison signals CP1 and CP2, and generate the digital output signal $D_{OUT}$ based on the received first and second comparison signals CP1 and CP2. In an SAR analog-digital conversion interval (for example, an SAR analog-digital conversion interval 42 of FIG. 4), in which an SAR analog-digital conversion operation is performed, digital logic circuitry 400 may generate the digital code $D_{OUT1}$, and the digital output signal $D_{OUT}$ may be equal to the digital code $D_{OUT1}$. For example, the digital code $D_{OUT1}$ may correspond to the first comparison signal CP1 or the second comparison signal CP2. In a delta sigma analog-digital conversion interval (for example, a delta sigma analog-digital conversion interval 43 of FIG. 4), in which a delta sigma analog-digital conversion operation is performed, digital logic circuitry 400 may generate first and second digital control signals $D_{OUT21}$ and $D_{OUT22}$, and the digital output signal $D_{OUT}$ may be equal to the average of the first and second digital control signals $D_{OUT21}$ and $D_{OUT22}$. For example, the first control signal $D_{OUT21}$ may correspond to the first comparison signal CP1 and the second control signal $D_{OUT22}$ may correspond to the second comparison signal CP2.

Figures 4, 5:
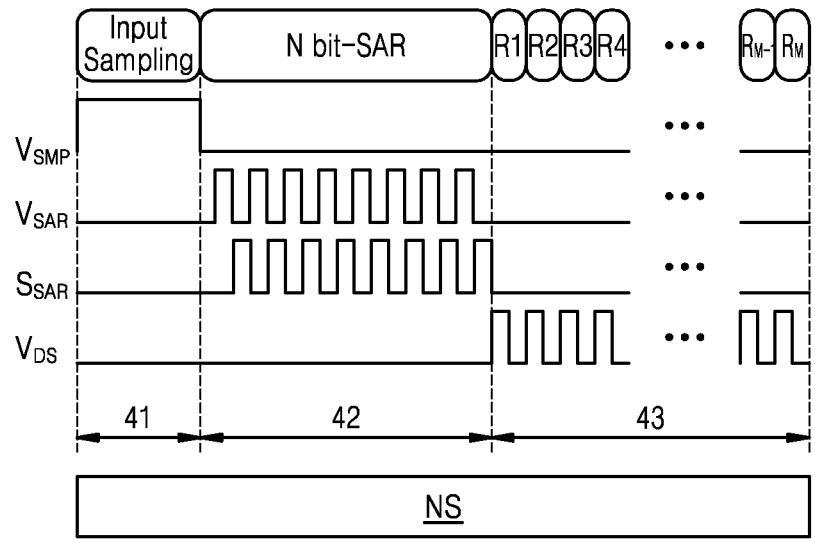
FIG. 4 is a timing diagram showing operations of the analog-digital converter having multiple feedback of FIG. 3.
FIG. 5 is a table in which an embodiment of a multiple feedback analog-digital converter, and a single feedback analog-digital converter are compared.

FIG. 4 is a timing diagram showing operations of analog-digital converter 30 of FIG. 3 having multiple feedback. Hereinafter, operations of analog-digital converter 30 are described with reference to FIGS. 3 and 4.

Analog-digital converter 30 having multiple feedback may be a noise shaping SAR analog-digital converter operating at a Nyquist frequency. Analog-digital converter 30 may perform an analog-digital conversion operation during the Nyquist sampling Interval NS, wherein the Nyquist sampling interval NS may include a sampling interval 41, SAR analog-digital conversion interval 42, and delta sigma analog-digital conversion interval 43. The sampling clock $V_{SMP}$ is activated in sampling interval 41, and accordingly, the analog input voltage $V_{IN}$ is sampled.

In SAR analog-digital conversion interval 42, an SAR analog-digital conversion operation may be performed on the sampled analog input voltage $V_{IN}$ according to the SAR clock $V_{SAR}$. When the SAR clock $V_{SAR}$ is activated, first and second comparators 341 and 342 may perform comparing operations. Also, in SAR analog-digital conversion interval 42, a switching operation of the reset switch $SW_R$ may be controlled according to the SAR control signal $S_{SAR}$. When the SAR control signal $S_{SAR}$ is activated, the reset switch $SW_R$ may be turned on and the integral signal IG may be reset.

When a resistor having a resistance R is connected to an output terminal of integrator 330 during the SAR analog-digital conversion operation, an SAR analog-digital conversion offset $V_{OS,SAR}$ may be calculated according to Equation 2.

$$V_{OS,SAR} = V_{OS1} + \frac{V_{OS2}}{g_m R} \qquad \text{[Equation 2]}$$

Here, $V_{OS1}$ denotes an integrator offset, $V_{OS2}$ denotes a comparator offset, $g_m$ denotes transconductance of integrator 330, and R denotes a resistance of a resistor connected to the output terminal of integrator 330 during the SAR analog-digital conversion operation. Also, when a capacitor is connected to the output terminal of integrator 330 during the delta sigma analog-digital conversion operation, a delta sigma offset $V_{OS,DS}$ may be calculated according to Equation 3.

$$V_{OS,DS} = V_{OS1} + \frac{V_{OS2}}{g_m r_O} \qquad \text{[Equation 3]}$$

Here, $V_{OS1}$ denotes an integrator offset, $V_{OS2}$ denotes a comparator offset, $g_m$ denotes transconductance of integrator 330, and $r_O$ denotes output impedance of integrator 330. Generally since a value of $r_O$ is much higher than that of R, an offset difference between the SAR analog-digital conversion offset $V_{OS,SAR}$ and the delta sigma offset $V_{OS,DS}$ may be $$\frac{V_{OS2}}{g_m R}.$$

When such an offset difference is greater than a feedback reference voltage of a delta sigma analog-digital converter, the delta sigma analog-digital converter may not normally operate. When $V_{REF}$ denotes a reference voltage of an SAR analog-digital converter and N denotes a resolution of the SAR analog-digital converter, a feedback reference voltage of a delta sigma analog-digital converter may be $V_{REF}/2^{N-1}$. For example, when N is 10 bits and $V_{REF}$ is 1 V, a feedback reference voltage is 2 mV, and when $V_{OS2}$ is 30 mV and $g_m R$ is 6, an offset difference is 5 mV. Here, since the offset difference is greater than the feedback reference voltage, the delta sigma analog-digital conversion operation is not normally performed. Accordingly, when the SAR analog-digital converter realizes a resolution of 7 bits or more, the SAR analog-digital converter needs to include a calibration circuit.

However, according to the current embodiment, the SAR control signal $S_{SAR}$ may be activated in SAR analog-digital conversion interval 42, and in detail, may be activated whenever the comparing operations of first and second comparators 341 and 342 are completed in SAR analog-digital conversion interval 42. Accordingly, the reset switch $SW_R$ may be turned on whenever the comparing operations of first and second comparators 341 and 342 are completed in response to the SAR control signal $S_{SAR}$, to reset a value stored in the integral capacitor $C_I$. Since the SAR control signal $S_{SAR}$ is not activated in delta sigma analog-digital conversion interval 43, the reset switch $SW_R$ does not operate in delta sigma analog-digital conversion interval 43. Accordingly, the SAR analog-digital conversion offset $V_{OS,SAR}$ and the delta sigma offset $V_{OS,DS}$ may be the same as Equation 4.

$$V_{OS,SAR} = V_{OS,DS} = V_{OS1} + \frac{V_{OS2}}{g_m r_O} \qquad \text{[Equation 4]}$$

Here, an offset difference between the SAR analog-digital conversion offset $V_{OS,SAR}$ and the delta sigma offset $V_{OS,DS}$ may be 0. Accordingly, the offset difference may be always smaller than a feedback reference voltage of the delta sigma analog-digital converter, and the delta sigma analog-digital converter may normally operate. Accordingly, analog-digital converter 30 may overcome an offset problem by using only the reset switch $SW_R$ without having to include an additional calibration circuit, and thus may realize high resolution.

Referring back to FIG. 2, in delta sigma analog-digital conversion interval 223, the delta sigma analog-digital conversion operation may be performed on the residue voltage $V_{RES}$ according to the delta sigma clock $V_{DS}$. For example, delta sigma analog-digital conversion interval 223 may include M clocks, wherein M may be a natural number. When the resolution of the SAR analog-digital converter increases, M may be increased, and accordingly, power consumption of analog-digital converter 30 may be increased. Also, when M is increased, an internal clock needs to be much faster than the sampling clock $V_{SMP}$, and thus integrator 330 and first and second comparators 341 and 342 need to have wide bandwidths. Accordingly, integrator noise and comparator noise may be further increased.

However, according to the current embodiment, analog-digital converter 30 may have low power consumption by having a multiple feedback structure. In detail, analog-digital converter 30 may include first and second comparators 341 and 342 and the first and second feedback capacitors $C_{F1}$ and $C_{F2}$, and reduce power consumption by feeding back the first and second comparison signals CP1 and CP2 output from first and second comparators 341 and 342 to the first and second feedback capacitors $C_{F1}$ and $C_{F2}$.

In detail, the capacitance of each of the first and second feedback capacitors $C_{F1}$ and $C_{F2}$ may correspond to ½ of a capacitance of a single feedback capacitor (for example, the feedback capacitor $C_F$ of FIG. 1) included in an analog-digital converter having a single feedback structure (for example, analog-digital converter 10 of FIG. 1). Accordingly, each feedback reference voltage is $V_{REF}/2^N$, and may correspond to ½ of a feedback reference voltage of the analog-digital converter having the single feedback structure. Accordingly, comparator noise of analog-digital converter 30 may also correspond to ½ of that of the analog-digital converter having the single feedback structure, and noise power of analog-digital converter 30 may correspond to ¼ of that of the analog-digital converter having a single feedback structure since noise power is in proportion to an involution of noise.

FIG. 5 is a table in which an embodiment of a multiple feedback analog-digital converter, and a single feedback analog-digital converter are compared.

Referring to FIG. 5, the single feedback analog-digital converter may include one comparator, and the multiple feedback analog-digital converter may include K comparators. Accordingly, the single feedback analog-digital converter may include one feedback capacitor, and the multiple feedback analog-digital converter may include K feedback capacitors. Here, a capacitance of each of the K feedback capacitors included in the multiple feedback analog-digital converter may correspond to 1/K of a capacitance of the feedback capacitor included in the single feedback analog-digital converter.

Here, noise power of the single feedback analog-digital converter may be $V_N^2$, and noise power of the multiple feedback analog-digital converter may be $V_N^2/K^2$. In this regard, $V_N^2/K^2$ corresponds to noise power of each comparator. Also, when power consumption of the single feedback analog-digital converter is P, power consumption of the multiple feedback analog-digital converter may be P/K. In this regard, P/K corresponds to power consumption of K comparators. An offset difference between the SAR analog-digital conversion offset $V_{OS,SAR}$ and the delta sigma offset $V_{OS,DS}$ is $VO_{S,COMP}/g_mR$ in the single feedback analog-digital converter, whereas it is near 0 in the multiple feedback analog-digital converter. As such, the multiple feedback analog-digital converter has remarkably lower power consumption than the single feedback analog-digital converter, and since the offset difference is near 0, the delta sigma analog-digital converter may normally operate.

Figure 6:
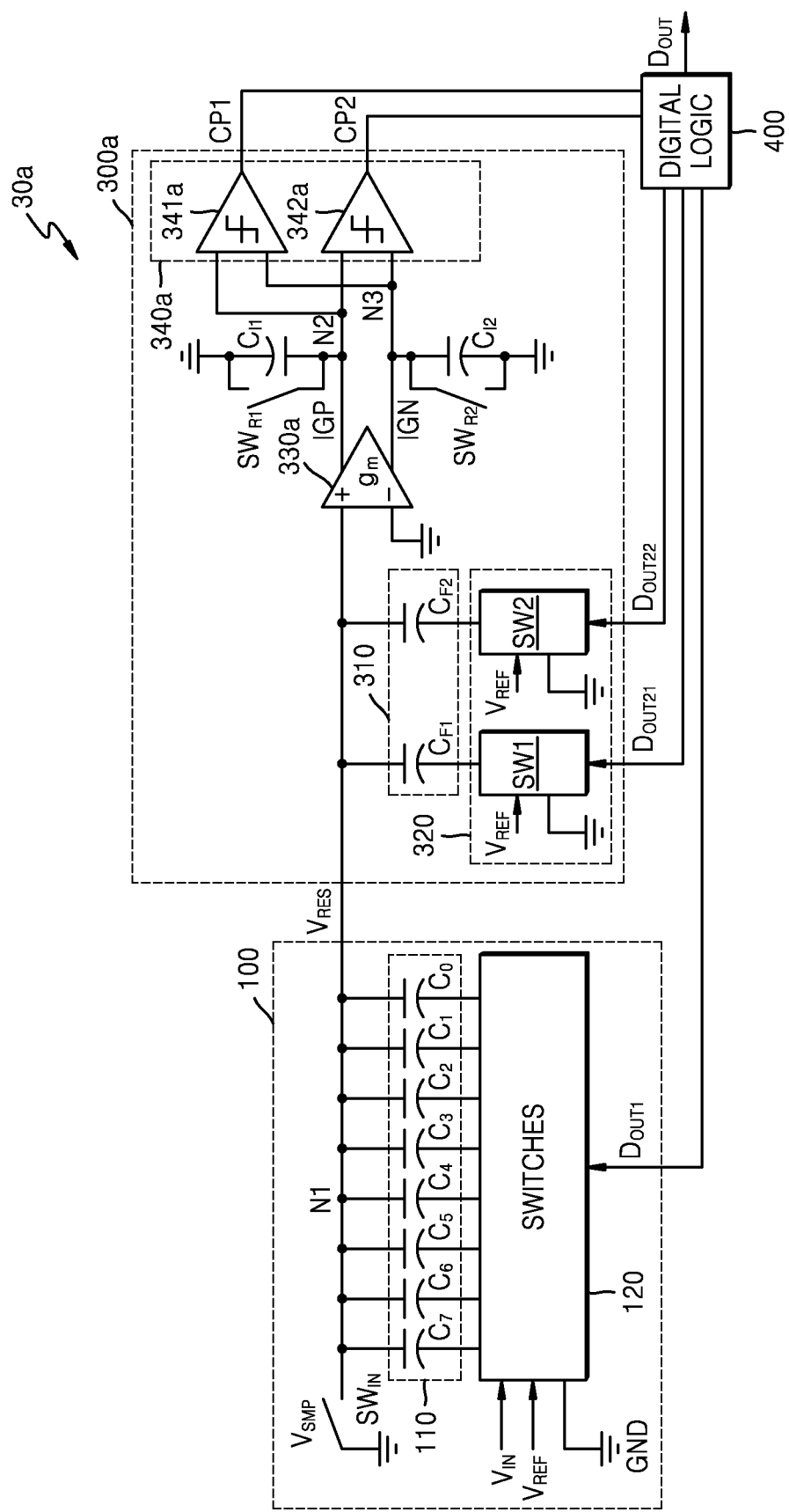
FIG. 6 is a circuit diagram of another embodiment of an analog-digital converter having multiple feedback.

FIG. 6 is a circuit diagram of another embodiment of an analog-digital converter 30a having multiple feedback.

Referring to FIG. 6, analog-digital converter 30a may include capacitor DAC 100, a delta sigma analog-digital converter 300a, and digital logic circuitry 400. Delta sigma analog-digital converter 300a may include the plurality of feedback capacitors 310, feedback switches 320, a differential integrator 330a, first and second integral capacitors $C_{I1}$ and $C_{I2}$, first and second reset switches $SW_{R1}$ and $SW_{R2}$, and a plurality of comparators 340a. The plurality of comparators 340a may include first and second comparators 341a and 342a.

Differential integrator 330a may include a first output terminal connected to the second node N2 and a second output terminal connected to a third node N3. Differential integrator 330a may output the first integral signal IGP from the first output terminal and the second integral signal IGN from the second output terminal. For example, the first integral signal IGP may be a positive integral signal and the second integral signal IGN may be a negative integral signal. The first integral capacitor $C_{I1}$ may be connected between the second node N2 and a ground voltage terminal, and the first reset switch $SW_{R1}$ may be connected across the first integral capacitor $C_{I1}$ in parallel. The second integral capacitor $C_{I2}$ may be connected between the third node N3 and the ground voltage terminal, and the second reset switch $SW_{R2}$ may be connected across the second integral capacitor $C_{I2}$ in parallel.

First comparator 341a may include a first input terminal connected to the second node N2 and a second input terminal connected to the third node N3. First comparator 341a may generate the first comparison signal CP1 by comparing the first integral signal IGP and the second integral signal IGN. second comparator 342a may include a first input terminal connected to the second node N2 and a second input terminal connected to the third node N3. Second comparator 342a may generate the second comparison signal CP2 by comparing the first integral signal IGP and the second integral signal IGN.

Figure 7:
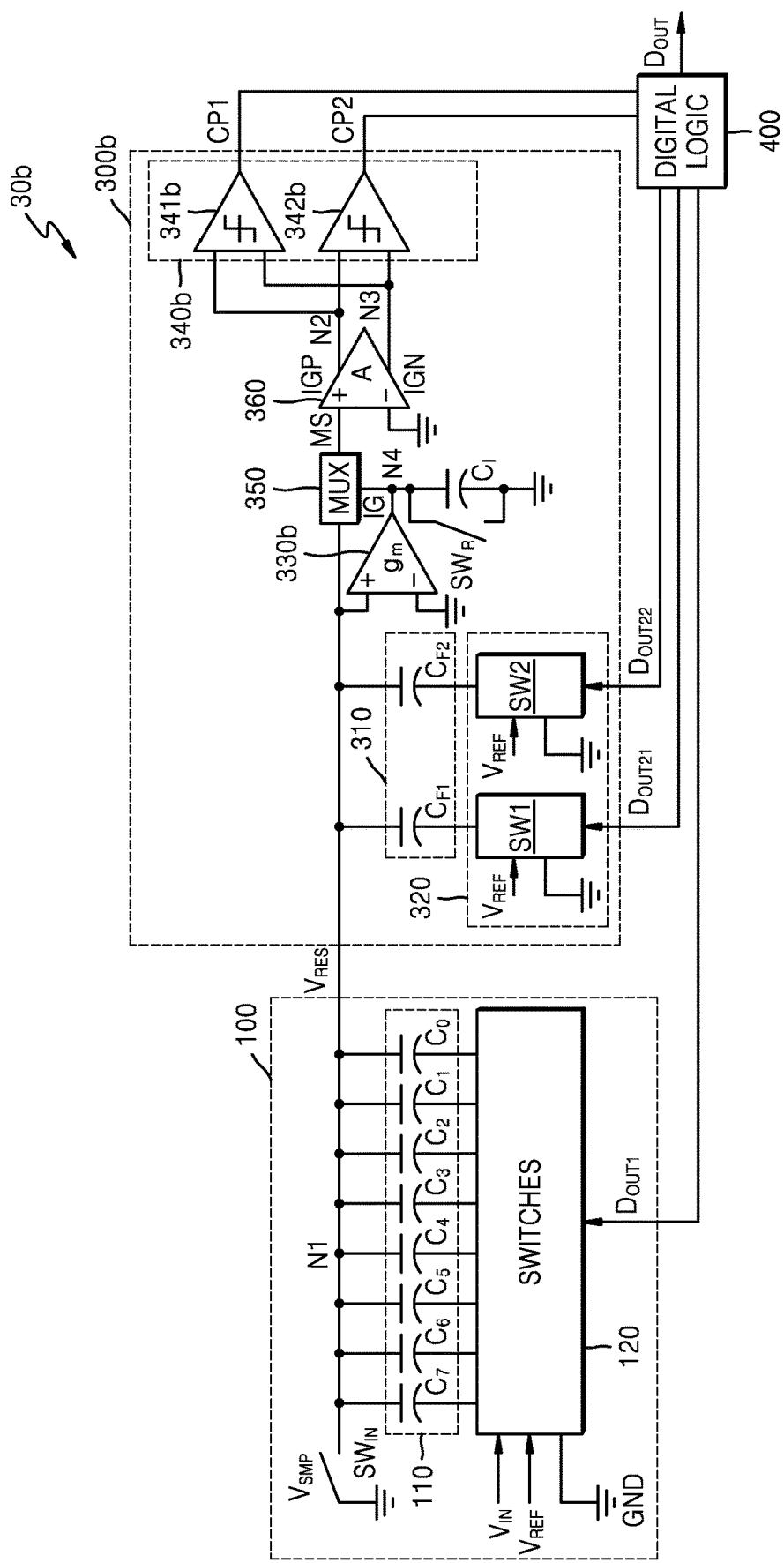
FIG. 7 is a circuit diagram of another embodiment of an analog-digital converter having multiple feedback.

FIG. 7 is a circuit diagram of an analog-digital converter 30b having multiple feedback, according to another embodiment.

Referring to FIG. 7, analog-digital converter 30b may include capacitor DAC 100, a delta sigma analog-digital converter 300b, and digital logic circuitry 400. Delta sigma analog-digital converter 300b may include the plurality of feedback capacitors 310, feedback switches 320, an integrator 330b, the integral capacitor $C_I$, the reset switches $SW_R$, a multiplexer (MUX) 350, a pre-amplifier 360, and a plurality of comparators 340b. The plurality of comparators 340b may include first and second comparators 341b and 342b.

Integrator 330b may include a first input terminal connected to the first node N1 and a second input terminal receiving the ground voltage GND. Integrator 330b may generate the integral signal IG by integrating the residue voltage $V_{RES}$. The integral capacitor $C_I$ may be connected between a fourth node N4 and the ground voltage terminal, and the reset switch $SW_R$ may be connected across the integral capacitor $C_I$ in parallel. Multiplexer 350 may receive the residue voltage $V_{RES}$ and the integral signal IG, and perform multiplexing on the residue voltage $V_{RES}$ and the integral signal IG to generate a multiplexed signal MS.

Pre-amplifier 360 may include a first input terminal receiving the multiplexed signal MS and a second input terminal receiving the ground voltage GND. Also, pre-amplifier 360 may include a first output terminal connected to the second node N2 and a second output terminal connected to the third node N3. Pre-amplifier 360 may amplify the multiplexed signal MS to generate the first integral signal IGP at the first output terminal and generate the second integral signal IGN at the second output terminal.

First comparator 341b may include a first input terminal connected to the second node N2 and a second input terminal connected to the third node N3. First comparator 341b may generate the first comparison signal CP1 by comparing the first integral signal IGP and the second integral signal IGN. Second comparator 342b may include a first input terminal connected to the second node N2 and a second input terminal connected to the third node N3. Second comparator 342b may generate the second comparison signal CP2 by comparing the first integral signal IGP and the second integral signal IGN.

Figure 8:
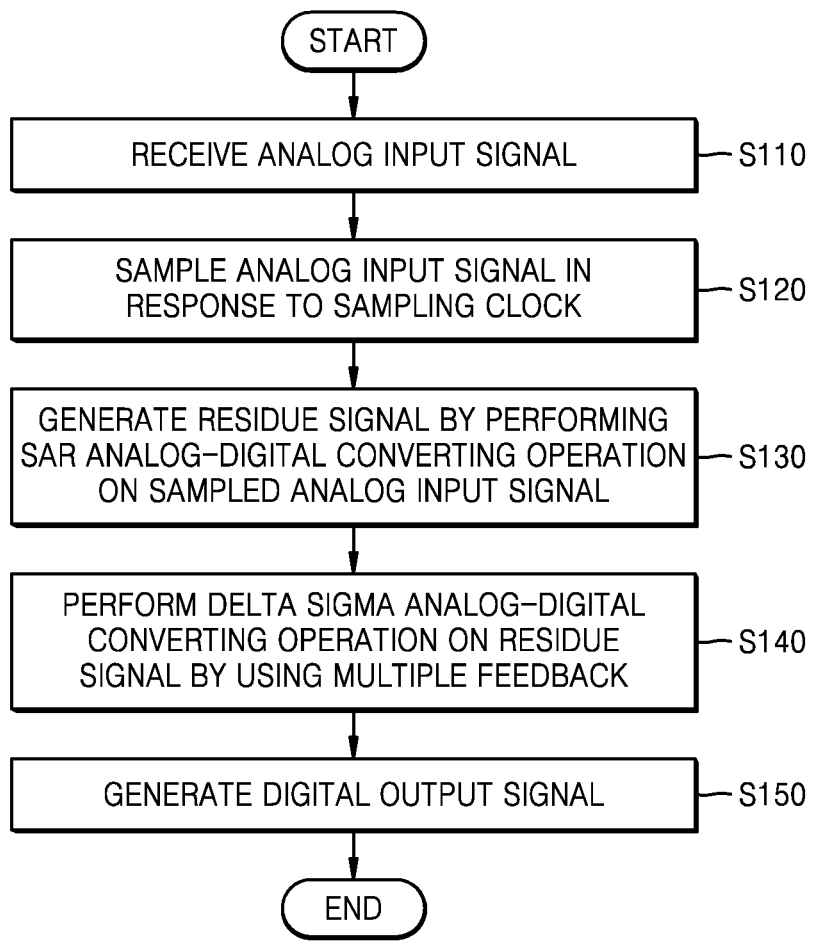
FIG. 8 is a flowchart of an embodiment of a method of analog-digital conversion.

FIG. 8 is a flowchart of an embodiment of a method of analog-digital conversion.

Referring to FIG. 8, the method of analog-digital conversion is performed by an analog-digital converter having multiple feedback. Details described with reference to FIGS. 1 through 7 above may be applied to the current embodiment, and redundant descriptions may not be provided again. The analog-digital conversion method according to the current embodiment may include, for example, operations performed sequentially by analog-digital converter 30 having multiple feedback of FIG. 3. Hereinafter, the embodiment of a method of analog-digital conversion is described with reference to FIGS. 3 and 8.

In operation S110, an analog input signal is received. For example, analog-digital converter 30 may receive the analog input voltage $V_{IN}$. In operation S120, the analog input signal is sampled in response to a sampling clock. For example, analog-digital converter 30 may sample the analog input voltage $V_{IN}$ in response to the sampling clock $V_{SMP}$. In operation S130, a residue signal is generated by performing an SAR analog-digital conversion operation on the sampled analog input signal. For example, analog-digital converter 30 may generate the residue voltage $V_{RES}$ by performing the SAR analog-digital conversion operation on the sampled analog input voltage $V_{IN}$ according to the digital code $D_{OUT1}$.

In operation S140, a delta sigma analog-digital conversion operation is performed on the residue signal by using multiple feedback. For example, analog-digital converter 30 may feed back the first and second digital control signals $D_{OUT21}$ and $D_{OUT22}$ respectively corresponding to the first and second comparison signals CP1 and CP2 respectively generated by first and second comparators 341 and 342 to the first and second feedback capacitors $C_{F1}$ and $C_{F2}$. Also, analog-digital converter 30 may perform the delta sigma analog-digital conversion operation on the residue voltage $V_{RES}$ stored in the first and second feedback capacitors $C_{F1}$ and $C_{F2}$. In operation S150, a digital output signal is generated. For example, analog-digital converter 30 may generate the digital output signal $D_{OUT}$ according to a result of performing the SAR analog-digital conversion operation and a result of performing the delta sigma analog-digital conversion operation.

Figure 9:
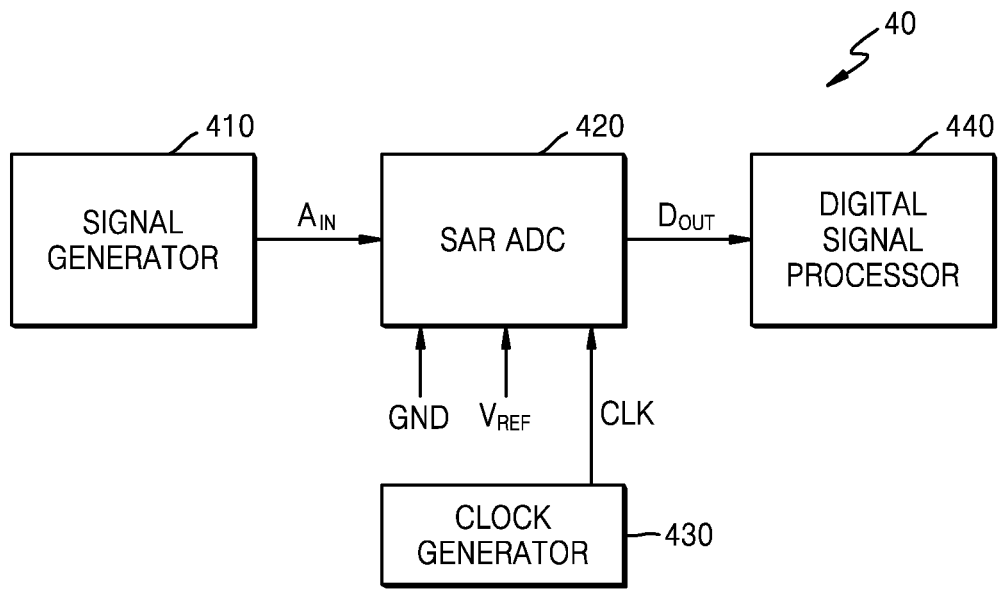
FIG. 9 is a block diagram of an embodiment of a semiconductor apparatus.

FIG. 9 is a block diagram of an embodiment of a semiconductor apparatus 40.

Referring to FIG. 9, semiconductor apparatus 40 may include a signal generator 410, an SAR analog-digital converter 420, a clock generator 430, and a digital signal processor 440. Semiconductor apparatus 40 may be a semiconductor apparatus that performs an analog-digital conversion operation by using the SAR analog-digital converter 420, and processes the digital output signal $D_{OUT}$. Semiconductor apparatus 40 may be an integrated circuit (IC), a central processor unit (CPU), a graphic processing unit (GPU), a system-on-chip (SoC), a processor, an application processor (AP), a modem chip, or a mobile device.

Signal generator 410 may provide an analog input signal $A_{IN}$ to SAR analog-digital converter 420. Clock generator 430 may provide a clock signal CLK to SAR analog-digital converter 420. For example, the clock signal CLK may correspond to a sample clock (for example, the sampling clock $V_{SMP}$ of FIG. 4). SAR analog-digital converter 420 may receive the ground voltage GND, the reference voltage $V_{REF}$, and the clock signal CLK, and generate the digital output signal $D_{OUT}$ by performing an analog-digital conversion operation on the analog input signal $A_{IN}$. SAR analog-digital converter 420 may be embodied as analog-digital converter 10 of FIG. 1, analog-digital converter 30 of FIG. 3, analog-digital converter 30a of FIG. 6, or analog-digital converter 30b of FIG. 7. Here, SAR analog-digital converter 420 may be an asynchronous SAR analog-digital converter. Digital signal processor 440 may be a circuit processing the digital output signal $D_{OUT}$.

Figure 10:
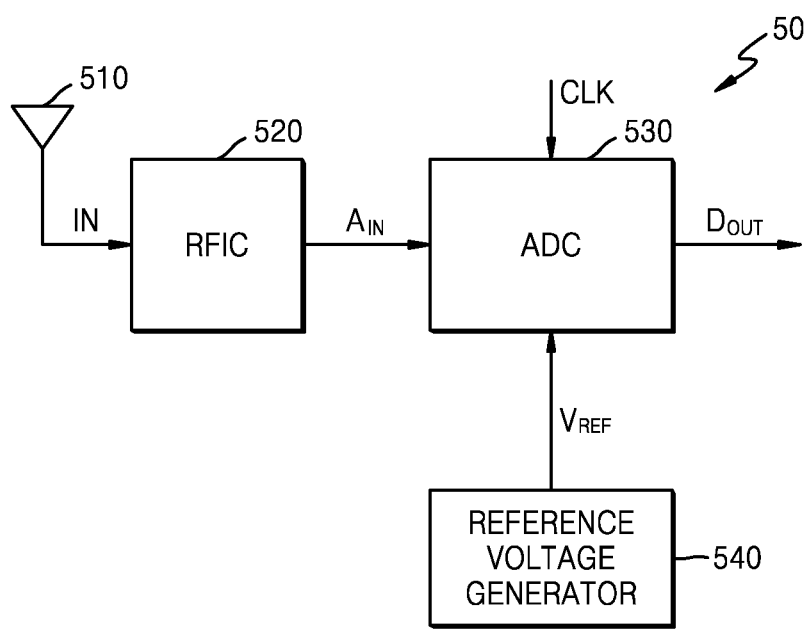
FIG. 10 is a block diagram of an embodiment of a communication device.

FIG. 10 is a block diagram of an embodiment of a communication device 50.

Referring to FIG. 10, communication device 50 may include an antenna 510, a radio frequency integrated chip (RFIC) 520, an analog-digital converter 530, and a reference voltage generator 540. According to an embodiment, communication device 50 may be a receiving terminal that receives various types of information. However, an embodiment is not limited thereto, and communication device 50 may be a transmitting terminal transmitting various types of information, or a transceiver that preforms transmitting and receiving functions. Various components included in communication device 50 may be implemented in hardware, including an analog circuit and/or a digital circuit, or may be implemented as software code including a plurality of instructions executed by a processor of communication device 50.

RFIC 520 may receive a communication signal, in particular an RF signal IN, through antenna 510, and may generate a baseband signal by performing down-conversion on the received RF signal IN. Here, the baseband signal may be referred to as the analog input signal $A_{IN}$. According to an embodiment, RFIC 520 may generate the analog input signal $A_{IN}$ through a direct conversion technique in which the RF signal IN is directly converted to a baseband. According to an embodiment, RFIC 520 may convert the RF signal IN to an intermediated frequency (IF) signal, and generate the analog input signal $A_{IN}$ via two-stage down-conversion in which the IF signal is converted to a baseband signal.

Analog-digital converter 530 may receive the analog input signal $A_{IN}$, and convert the received analog input signal $A_{IN}$ to the digital output signal $D_{OUT}$. According to the current embodiment, analog-digital converter 530 may be embodied as analog-digital converter 10 of FIG. 1, analog-digital converter 30 of FIG. 3, analog-digital converter 30a of FIG. 6, or analog-digital converter 30b of FIG. 7. Reference voltage generator 540 may generate the reference voltage $V_{REF}$, and provide the generated reference voltage $V_{REF}$ to analog-digital converter 530.

Figure 11A:
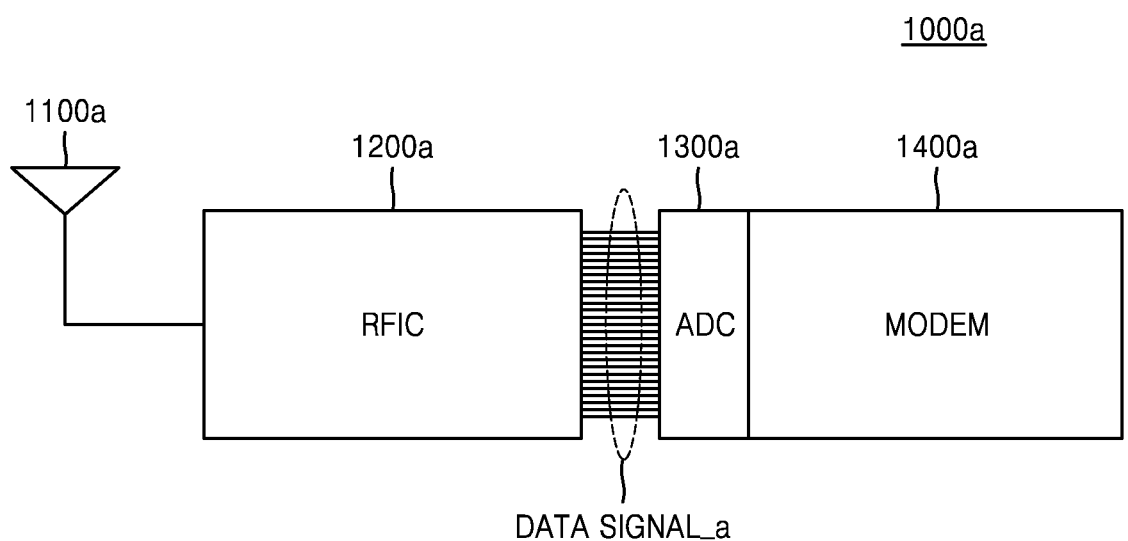
FIGS. 11A and 11B are block diagrams of embodiments of communication devices.
Figure 11B:
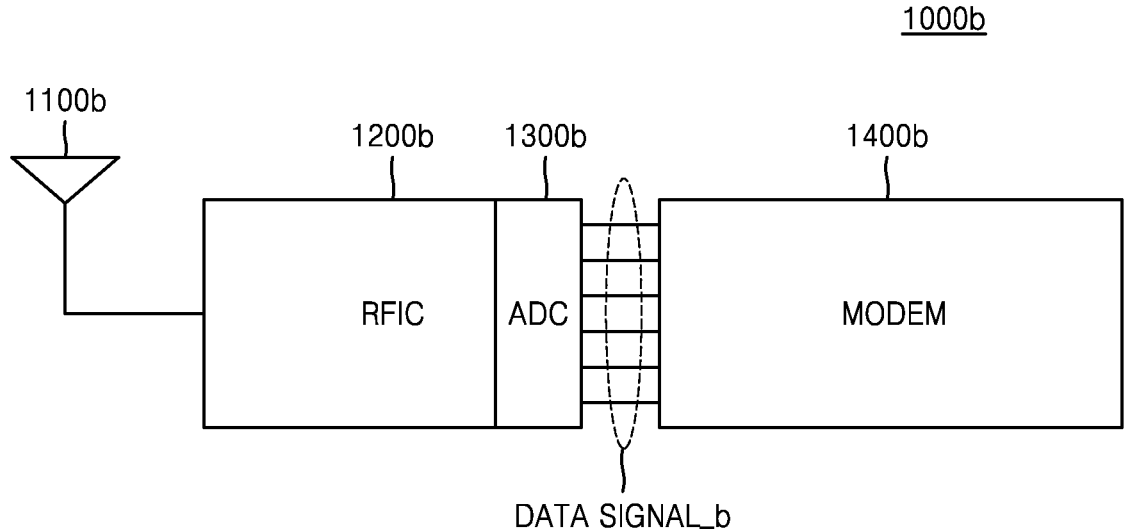

FIGS. 11A and 11B are block diagrams of embodiments of communication devices.

Referring to FIG. 11A, communication device 1000a may include an antenna 1100a, an RFIC 1200a, an analog-digital converter 1300a, and a modem 1400a. RFIC 1200a according to an embodiment may receive a wireless signal through antenna 1100a, reduce a frequency of the wireless signal to a baseband, and provide an analog data signal DATA SIGNAL_a to analog-digital converter 1300a. Analog-digital converter 1300a may convert the analog data signal DATA SIGNAL_a to a digital data signal, and modem 1400a may convert the digital data signal to a data signal processable by an AP. According to an embodiment, analog-digital converter 1300a and modem 1400a may be embodied in a single chip. The single chip including analog-digital converter 1300a and modem 1400a may be connected to RFIC 1200a through a plurality of analog signal lines. Thus, an embodiment may be a modem chip.

Referring to FIG. 11B, unlike FIG. 11A, an RFIC 1200b and an analog-digital converter 1300b may be embodied in a single chip. The single chip including RFIC 1200b and analog-digital converter 1300b may transmit a digital input signal DATA SIGNAL_b to a modem 1400b. Modem 1400b may convert the digital input signal DATA SIGNAL_b to a data signal processable by an AP. The single chip including RFIC 1200b and analog-digital converter 1300b may be connected to modem 1400b through a plurality of digital signal lines. Accordingly, an embodiment may be an RF chip.

When RFIC 1200b and analog-digital converter 1300b of FIG. 11B are embodied in a single chip, the number of signal lines for transmitting the digital input signal DATA SIGNAL_b to modem 1400b may be less than the number of signal lines for transmitting the analog input signal DATA SIGNAL_a of FIG. 11A. However, embodiments are not limited thereto, and RFIC 1200b, analog-digital converter 1300b, and modem 1400b all may be embodied in a single chip, and moreover, RFIC 1200b, the analog-digital converter 1300b, modem 1400b, and the AP all may be embodied in a single chip.

Figure 12:
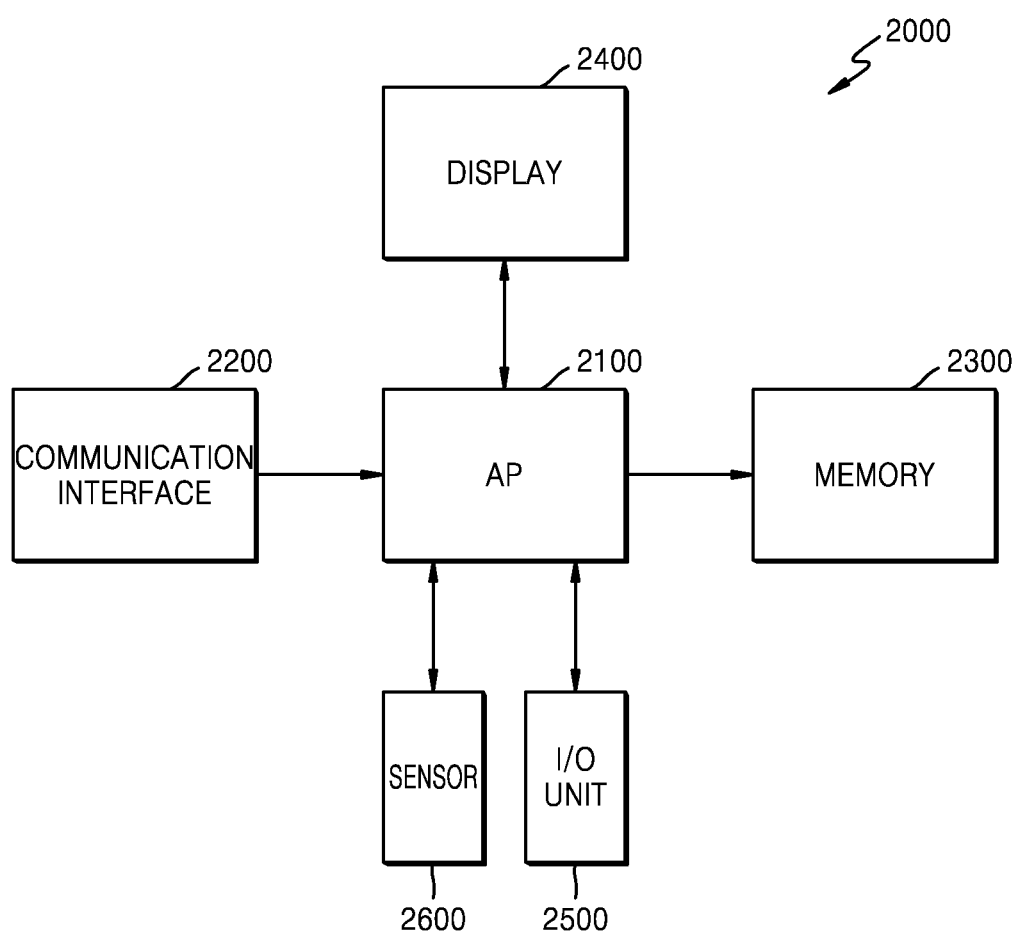
FIG. 12 is a block diagram of an embodiment of an Internet of Things (IoT) device.

FIG. 12 is a block diagram of an embodiment of an Internet of Things (IoT) device 2000.

Referring to FIG. 12, an analog-digital converter according to one or more embodiments may be included in IoT device 2000. IoT may denote a network between things using wired/wireless communication. IoT device 2000 may include devices that have an accessible wired or wireless interface, communicate with at least one another device through the wired or wireless interface, and receive or transmit data. Examples of the accessible wired or wireless interface include a local area network (LAN) interface, a wireless local area network (WLAN) interface like a Wi-Fi interface, a wireless personal area network (WPAN) interface like a Bluetooth interface, a wireless universal serial bus (USB) interface, a ZigBee interface, a near field communication (NFC) interface, a radio frequency identification (RFID) interface, a power line communication (PLC) interface, and a modem communication interfaces accessible to a mobile cellular network like 3G, 4G, or long-term evolution (LTE). Here, the Bluetooth interface may support Bluetooth low energy (BLE).

For example, IoT device 2000 may include a communication interface 2200 for communicating with an external device. Communication interface 2200 may be a LAN interface, a WLAN interface like a Bluetooth, Wi-Fi, or ZigBee interface, a PLC interface, or a modem communication interface accessible to a mobile communication network, such as 3G or LTE. Communication interface 2200 may include a transceiver and/or a receiver. IoT device 2000 may transmit and/or receive information to and/or from an access point or a gateway through the transceiver and/or the receiver. Also, IoT device 2000 may transmit and/or receive control information or data of IoT device 2000 by communicating with a user device or another IoT device.

According to the current embodiment, the receiver included in communication interface 2200 may include an analog-digital converter that may be realized based on FIGS. 1 through 11B. For example, the analog-digital converter may be analog-digital converter 10 of FIG. 1, analog-digital converter 30 of FIG. 3, analog-digital converter 30a of FIG. 6, or analog-digital converter 30b of FIG. 7. In detail, the receiver included in communication interface 2200 may include the analog-digital converter.

IoT device 2000 may further include a processor or an AP 2100 performing calculations and/or other operations. IoT device 2000 may further include a power supply unit (not shown) embedding a battery for internal power supply or receiving power from an external source. Also, IoT device 2000 may include a display 2400 for displaying an internal state or data. A user may control IoT device 2000 through a user interface (UI) of display 2400 (which may be a touchscreen display), and, in some embodiments, an input/output (I/O) unit 2500. IoT device 2000 may transmit the internal state and/or data through the transceiver, and receive a control command and/or data through the receiver.

A memory 2300 may store a control instruction code, control data, or user data for controlling IoT device 2000. Memory 2300 may include at least one of a volatile memory and a nonvolatile memory. The nonvolatile memory may include at least one of various memories, such as read-only memory (ROM), programmable ROM (PROM), electrically programmable ROM (EPROM), electrically erasable and programmable ROM (EEPROM), a flash memory, phase-change random access memory (PRAM), magnetic RAM (MRAM), resistive RAM (ReRAM), and ferroelectric RAM (FRAM). The volatile memory may include at least one of various memories, such as dynamic RAM (DRAM), static RAM (SRAM), and synchronous DRAM (SDRAM).

IoT device 2000 may further include a storage device (not shown). The storage device may be a nonvolatile medium, such as a hard disk drive (HDD), a solid state disk (SSD), an embedded multimedia card (eMMC), or universal flash storage (UFS). The storage device may store information of the user provided through input/output (I/O) unit 2500, and sensing information collected through a sensor 2600.

While the inventive concept has been particularly shown and described with reference to embodiments thereof, it will be understood that various changes in form and details may be made therein without departing from the spirit and scope of the following claims.

What is claimed is:

1. An analog digital converter having multiple feedback, the analog digital converter, comprising:

a capacitor digital-analog converter, including a plurality of switches driven by a digital code and a plurality of capacitors respectively connected to the plurality of switches, wherein the capacitor digital-analog converter is configured to generate a residue voltage based on an analog input voltage and a voltage corresponding to the digital code;

first and second feedback capacitors each storing the residue voltage;

an integrator configured to generate an integral signal by integrating the residue voltage;

first and second comparators respectively configured to generate first and second comparison signals from the integral signal; and a digital logic circuitry configured to receive the first and second comparison signals, and generate a digital output signal from the first and second comparison signals, the digital output signal corresponding to the digital code during a successive approximation register (SAR) analog-digital conversion interval, and the digital output signal corresponding to an average of first and second digital control signals during a delta sigma analog-digital conversion interval, wherein the first and second comparison signals are respectively fed back to the first and second feedback capacitors by the first and second digital control signals.

2. The analog digital converter of claim 1, further comprising:
a first feedback switch connected to the first feedback capacitor in series and driven by a first digital control signal corresponding to the first comparison signal; and
a second feedback switch connected to the second feedback capacitor in series and driven by a second digital control signal corresponding to the second comparison signal.

3. The analog digital converter of claim 2, wherein the first feedback switch is connected to a ground voltage terminal or a reference voltage terminal to which a reference voltage is applied, in response to the first digital control signal, and
the second feedback switch is connected to the ground voltage terminal or the reference voltage terminal in response to the second digital control signal.

4. The analog digital converter of claim 1, further comprising:
an integral capacitor connected between an output terminal of the integrator and a ground voltage terminal; and
a reset switch connected across the integral capacitor in parallel.

5. The analog digital converter of claim 4, wherein the reset switch is driven by an SAR control signal that is activated whenever comparing operations of the first and second comparators are completed during the SAR analog-digital conversion interval.

6. The analog digital converter of claim 1, wherein a first capacitance of the first feedback capacitor and a second capacitance of the second feedback capacitor are the same as each other.

7. The analog digital converter of claim 6, wherein the plurality of switches comprise a least significant bit (LSB) switch driven by an LSB of the digital code,
the plurality of capacitors comprise an LSB capacitor connected to the LSB switch, and
the first and second capacitances of the first and second feedback capacitors are the same as a capacitance of the LSB capacitor.

8. The analog digital converter of claim 1, further comprising:
a first integral capacitor connected between a first output terminal of the integrator and a ground voltage terminal;
a first reset switch connected across the first integral capacitor in parallel;
a second integral capacitor connected between a second output terminal of the integrator and the ground voltage terminal; and
a second reset switch connected across the second integral capacitor in parallel.

9. The analog digital converter of claim 8, wherein the first and second reset switches are driven by an SAR control signal that is activated whenever comparing operations of the first and second comparators are completed during an SAR analog-digital conversion interval.

10. The analog digital converter of claim 1, wherein each of the plurality of switches is connected to an input voltage terminal to which the analog input voltage is applied, a reference voltage terminal to which a reference voltage is applied, or a ground voltage terminal, in response to the digital code, during the SAR analog-digital conversion interval.

11. The analog digital converter of claim 1, wherein the analog digital converter operates at a Nyquist rate with respect to the analog input voltage.

12. A communication device comprising:
an analog-digital converter having multiple feedback and configured to convert an analog input signal to a digital output signal based on a reference voltage, wherein the analog input signal is produced from a communication signal received by the communication device; and
a reference voltage generator providing the reference voltage to the analog-digital converter, wherein:
the analog-digital converter comprises:
a capacitor digital-analog converter configured to receive the reference voltage, the analog input signal, and a digital code, and to generate a residue voltage based on the reference voltage, a first voltage corresponding to the digital code, and a second voltage corresponding to the analog input signal;
first and second feedback capacitors each storing the residue voltage;
an integrator configured to generate an integral signal by integrating the residue voltage; and
first and second comparators configured to respectively generate first and second comparison signals from the integral signal, and
the first and second comparison signals are respectively fed back to the first and second feedback capacitors.

13. The communication device of claim 12, further comprising digital logic configured to receive the first and second comparison signals, generate the digital code in a successive approximation register (SAR) analog-digital conversion interval, and generate first and second digital control signals respectively corresponding to the first and second comparison signals in a delta sigma analog-digital conversion interval.

14. The communication device of claim 13, wherein the capacitor digital-analog converter comprises:
a plurality of switches each connected to an input voltage terminal to which the analog input signal is applied, a reference voltage terminal to which the reference voltage is applied, or a ground voltage terminal, in response to the digital code in the SAR analog-digital conversion interval; and
a plurality of capacitors respectively connected to the plurality of switches in series.

15. The communication device of claim 13, wherein the analog-digital converter further comprises:
a first feedback switch connected to the first feedback capacitor in series and driven by the first digital control signal; and
a second feedback switch connected to the second feedback capacitor in series and driven by the second digital control signal.

16. The communication device of claim 12, wherein the analog-digital converter operates at a Nyquist rate with respect to the second voltage.

17. A device comprising:
a plurality of switches each connected, in response to a digital code supplied to the switches, to one of an input voltage terminal to which an analog input signal is applied, a reference voltage terminal to which a reference voltage is applied, and a ground voltage terminal;
a plurality of capacitors each having a first terminal connected to at least one of the plurality of switches and further having a second terminal, wherein the second terminals of the capacitors are connected together to generate a residue voltage based on the analog input signal and a voltage corresponding to the digital code;

first and second feedback capacitors each storing the residue voltage;

an integrator configured to generate an integral signal by integrating the residue voltage; and first and second comparators respectively configured to generate first and second comparison signals from the integral signal, wherein the first and second comparison signals are respectively fed back to the first and second feedback capacitors.

18. The device of claim 17, further comprising:

a first integral capacitor connected between a first output terminal of the integrator and a ground voltage terminal;

a first reset switch connected across the first integral capacitor in parallel;

a second integral capacitor connected between a second output terminal of the integrator and the ground voltage terminal; and a second reset switch connected across the second integral capacitor in parallel.

19. The device of claim 18, further comprising:

a multiplexer configured to receive the residue voltage and the integral signal and to output a multiplexed signal by multiplexing the residue voltage and the integral signal; and a preamplifier having a first input terminal connected to receive the multiplexed signal, a second input terminal connected to the ground voltage terminal, a first output terminal connected to a first input terminal of each of the first and second comparators, and a second output terminal connected to a second input terminal of each of the first and second comparators.

20. The device of claim 17, wherein the device is configured to operate at a Nyquist rate with respect to the analog input signal.

* * * * *